United States Patent [19]
Kutzavitch et al.

[11] Patent Number: 5,027,083
[45] Date of Patent: Jun. 25, 1991

[54] GENERAL PURPOSE LOW COST DIGITAL AMPLITUDE REGULATOR

[75] Inventors: Walter G. Kutzavitch, Freehold; Eugene J. Rosenthal, Highland Park, both of N.J.

[73] Assignee: AT&T Bell Laboratories, Murray Hill, N.J.

[21] Appl. No.: 482,443

[22] Filed: Feb. 20, 1990

[51] Int. Cl.$^5$ .............................................. H03G 3/10
[52] U.S. Cl. ..................................... 330/284; 381/109
[58] Field of Search ..................... 307/234, 350, 362; 330/278, 279, 284, 302; 381/104, 109

[56] References Cited

U.S. PATENT DOCUMENTS

| | | | |
|---|---|---|---|
| 3,942,181 | 3/1976 | Berrod et al. | 330/284 X |
| 4,435,679 | 3/1984 | Bedard et al. | 330/284 X |
| 4,468,631 | 8/1984 | Goldberg | 330/284 |
| 4,611,344 | 9/1986 | Hayama et al. | 381/109 X |
| 4,868,519 | 9/1989 | Shafer | 330/284 |

*Primary Examiner*—Steven Mottola
*Attorney, Agent, or Firm*—Thomas Stafford

[57] ABSTRACT

Apparatus for digital amplitude regulation is disclosed, for use as a volume control or the like, utilizing pulse width modulation to control gain through the variation of the incremental resistance of a two terminal non-linear element, the resistance of which varies with current, e.g., a diode or diode like element. A stream of pulses, the duty cycle of which is variable and digitally controlled, is filtered to produce a quasi-continuously variable direct-current (DC) voltage. The DC voltage either directly or by providing a DC current regulates the gain of an amplifier that is amplifying the signal of interest by regulating the transmission characteristics of the diode. For low cost implementation in a system already employing a microprocessor or microcomputer the determinative duty cycle can be derived under software control and supplied as an output from a single latchable output pin.

In an exemplary implementation, the incremental resistance of an ordinary silicon diode operated in accordance with the small signal model of a diode. Additionally, the use of an energy storing type filter allows the the continuous stream of variable duty cycle pulses to be momentarily interrupted so that a pin used for supplying the pulses can be used for the performance of additional functions without affecting the perceived volume level.

13 Claims, 1 Drawing Sheet

GENERAL PURPOSE LOW COST DIGITAL AMPLITUDE REGULATOR

CROSS-REFERENCE TO RELATED APPLICATION

U.S. patent application Ser. No. 07/482,442 was filed concurrently herewith.

TECHNICAL FIELD

This invention relates to digitally controlled variable gain amplifiers and, more particularly, to digital volume controls.

BACKGROUND OF THE INVENTION

Demand for higher functionality in today's consumer and business electronics continues to require greater complexity from modern circuits. The further requirement that such products be available at lower cost requires the reuse or multiple function use of as many components as possible. Many microprocessor based products such as telephones, digitally tuned radios, games and facsimile machines produce and/or transmit signals, the amplitudes of which must be regulated. Typically, this regulation process is performed under direct customer control, i.e., volume controls and the like, although there are implementations in which the regulation is done automatically. Today, there is an increasing trend toward push button control because of the low cost of physically providing a button and the circuitry to sense the state of the button. However, the digitally controlled regulators that are responsive to the state of the button continue to add substantial cost. Prior digital controls generally required multiple dedicated pins of a microprocessor or dedicated pins of a latched output port to set volume levels. These control systems typically utilized some type of digital to analog (D/A) converter to which a binary number is supplied as an input and from which a representative voltage magnitude of a predetermined set of voltage magnitudes is derived. This desired voltage magnitude is used to determine the gain of a voltage controlled amplifier.

Alternatively, multiple controls for shunting or series incorporating elements, typically resistors, are used to set the gain of an amplification stage. In order to reduce costs, component count and thus the number of gain settings was limited, resulting in noticeable discontinuity between magnitude levels. These prior gain regulation systems did, however, enjoy the advantage of simple and straight forward software development and implementation.

Another prior gain regulation system, disclosed in U.S. Pat. No. 4,868,519, uses microprocessor control to generate a variable duty cycle waveform that indirectly controls the drain to source resistance of an FET which is constantly monitored via a feedback loop, to regulate the gain of a two stage amplifier. Still other gain regulators, such as disclosed in U.S. Pat. No. 4,468,631, suggest the use of FETs or photo-resistors and photo-transistors for use in amplitude control apparatus. These systems are relatively expensive to implement because of their complexities. Additional cost is typically incurred by the introduction of nonessential elements that introduce indirectness of control and, most notably, in the use of feedback to monitor the actual value of the gain controlling factor or mechanism.

SUMMARY OF THE INVENTION

The prior difficulties with digital amplitude regulators, such as volume controls and the like, are avoided, in accordance with an aspect of the invention, by utilizing pulse width modulation to control gain through the variation of the incremental resistance of a two terminal non-linear element whose resistance varies with current, e.g., a diode or diode like element. A continuous stream of pulses, the duty cycle of which is variable and digitally controlled, is filtered to produce a quasi-continuously variable direct-current (DC) voltage. The DC voltage, either directly or by providing a DC current, regulates the gain of an amplifier by controlling the transmission characteristics of the diode. For low cost implementation in a system already employing a microprocessor or microcomputer the determinative duty cycle can be derived under software control and supplied as an output from a single latchable output pin.

In an exemplary implementation, a DC voltage and a corresponding current is generated in response to variable duty cycle pulses by a two stage passive filter. The DC current is used to control the incremental resistance of an ordinary silicon diode operated in accordance with the small signal model of a diode. The diode is substituted for the input resistor in a basic inverting configuration op-amp amplifier, thus directly determining the gain of the amplifier which varies in accordance with the input resistance.

One advantage of this system is that because of the natural filtering action inherent in the basic operating principals of the system coupled with the large number of discrete duty cycles that even a reasonably highly loaded microprocessor can produce, the transition between levels can easily be made to appear continuous to a user. Additionally, the use of an energy storing type filter allows, in accordance with another aspect of the invention, the stream of variable duty cycle pulses to be momentarily interrupted so that the pin used for supplying the pulses can be used for the performance of additional functions without affecting the perceived volume level. Thus, for example, the pin can also be used as an output that supplies pulses for scanning a key pad for button depressions. A further advantage of the invention is that it can be easily implemented in a system with only a single voltage supply.

BRIEF DESCRIPTION OF THE DRAWING

In the Drawing:

Shown in FIG. 1 is an example implementation wherein the amplitude of an input signal is digitally regulated in accordance with aspects of the invention.

DETAILED DESCRIPTION

Figure 1:
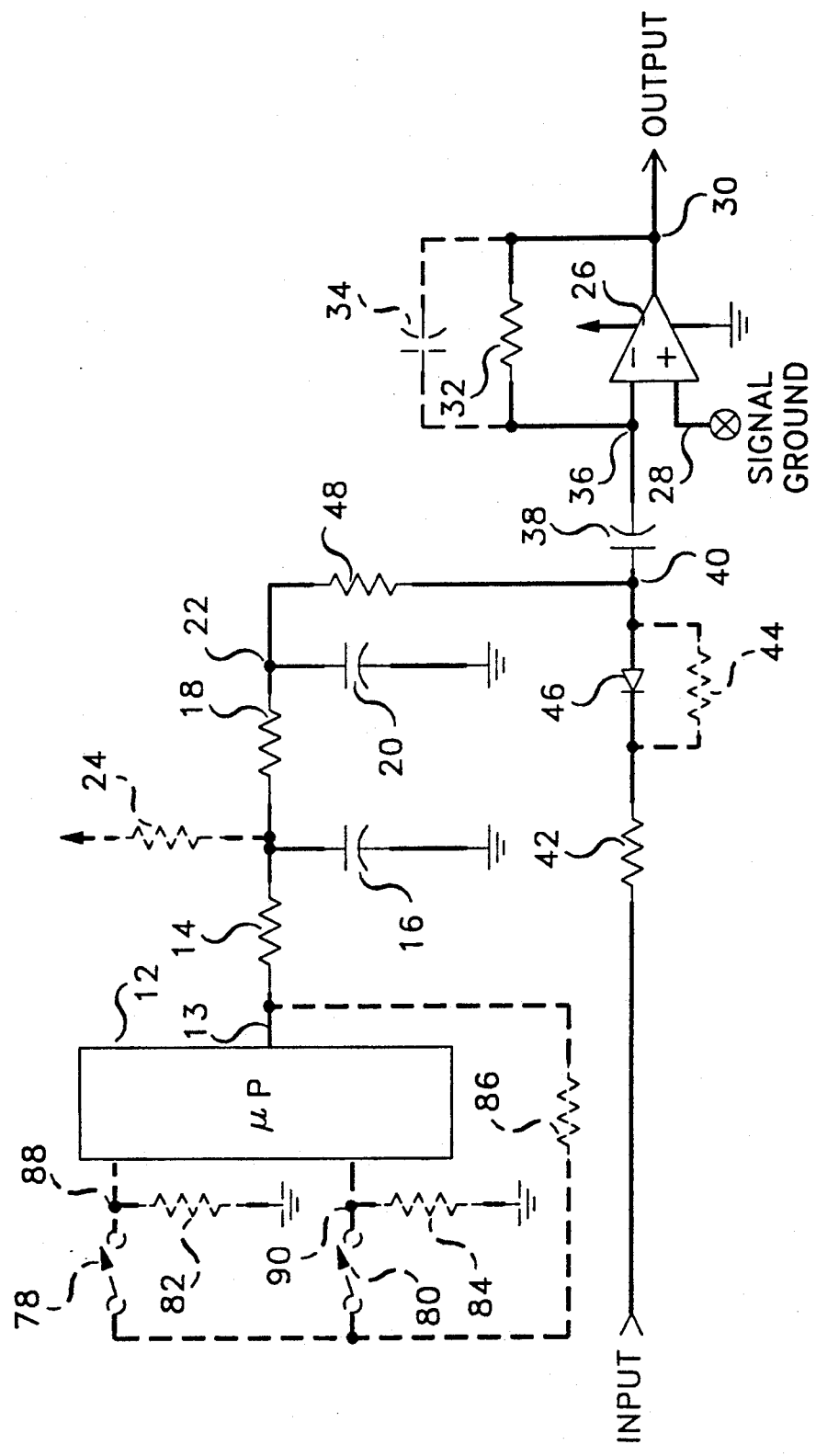

Shown in FIG. 1 is an example implementation wherein variable width pulses of a fixed frequency, i.e., variable duty cycle pulses, are produced under software control by microcomputer 12. Microcomputer 12 is, for example, an 8-bit microcomputer such as MC68HC05C4 made by the Motorola Corporation. Any known technique for generating and digitally controlling the duty cycle of the pulses may be used. For purposes of the present example, it is assumed that the software of microcomputer 12 is responsive to a keyboard or serial message system (not shown), to determine the actual duty cycle to be used at any particular moment. If the amplitudes of multiple signals are to be independently controlled by a single microprocessor each independent control will require its own latchable output pin and corresponding circuitry. The pulses from microprocessor 12 supplied from pin 13 are filtered by a two stage passive filter in which the first stage is comprised of resistor 14 and capacitor 16 and the second stage is comprised of resistor 18 and capacitor 20. The result of the filtering of the variable width pulses is a DC voltage at node 22, the magnitude of which is used as a reference signal. The magnitude of the voltage at node 22 is proportional to and varies directly with the duty cycle of the pulses. Changes in the duty cycle will be tracked by corresponding changes in the reference signal, i.e., voltage magnitude. Resistors 14 and 18 and capacitors 16 and 20 are selected so that the DC voltage maintained at node 22 is stable for any particular duty cycle, and yet, an undue amount of time, as perceived by a user, is not necessary to effect the required changes in the DC voltage. In this example, microcomputer 12 provides a pulse width modulated signal, at an amplitude of 5 volts peak-to peak the duty cycle of which may vary anywhere from 0% to 100%. Thus, the voltage at node 22 will vary from nearly 0 volts at a duty cycle of 0% to nearly 5 volts at a duty cycle of 100% with correspondingly proportionate voltages produced at corresponding duty cycles. Optional resistor 24 can be used to change the ratio of dependence of the voltage at node 22 to the duty cycle of the pulses. Thus, resistor 24 can be used to allow a large variation in duty cycle to translate into a smaller variation of voltage magnitude. This result is due to the voltage divider action between resistor 14 and resistor 24.

Operational-Amplifier (op-amp) 26 is connected as a basic inverting amplifier. Non-inverting node 28 is connected to signal ground, a fixed predetermined DC voltage, the magnitude of which is selected to allow maximum distortion free output voltage swing of the selected op-amp. For simplicity, the magnitude of signal ground should not be less than the minimum or more than the maximum voltage that can be directly supplied by the variable duty cycle pulses. If the magnitude of signal ground is less than the minimum or more than the maximum voltage that can be directly supplied by the variable duty cycle pulses some type of level shifting must be performed on the pulses. Level shifting is well known in the art. Output node 30 is fed back through the parallel combination of feedback resistor ($R_f$) 32 and optional capacitor 34 to the inverting input terminal of the op-amp 26 at node 36. Optional feedback capacitor 34 is used to provide a high frequency roll off if it is desired. The value of feedback resistor 32 determines the overall gain in conjunction with the input resistance of the op-amp. Closing of the feedback loop causes a virtual signal ground to appear at the inverting input terminal of the op-amp, i.e., at node 36. Capacitor 38 blocks the transmission of DC but appears as a short circuit to alternating current (AC) signals. Thus, the AC virtual signal ground from the inverting input terminal is extended to appear at node 40.

An input signal from a signal source, the magnitude of which is to be regulated, is supplied to resistor 42. As will be shown later, resistor 42, in conjunction with feedback resistor 32 determines the maximum gain of the system. The input signal contains a constant, fixed, predetermined DC component. For illustrative purposes, the magnitude of the DC component of the input signal will be chosen to be equal to the magnitude of the DC voltage used for the signal ground. With optional resistor 44 not in the circuit and capacitor 38 blocking DC transmission to the op-amp, a DC voltage divider is formed between the DC voltages present at node 22 and at the signal input. As long as the duty cycle of the variable duty cycle pulses is maintained so that the voltage at node 22 is less than or equal to the DC voltage component of the input signal diode 46 remains in a non-conducting state. Therefore, none of the AC component of the input signal reaches node 40 or the op-amp. As the duty cycle of the variable duty cycle pulses is increased, in accordance with an aspect of the invention, the magnitude to the reference voltage at node 22 will increase to a magnitude larger than the DC voltage component of the input signal. Diode 46 will turn on and a DC current will flow through resistor 48, diode 46 and resistor 42. This DC current is $I_d$, the bias current for diode 46. The magnitude of $I_d$ is dependent upon and varies with the magnitude of the reference voltage at node 22. At any instant and for any chosen combination of values and duty cycle the value of the magnitude of $I_d$ can be calculated using techniques that are well known in the art. The value of resistor 48 is chosen to be relatively large so that the magnitude of $I_d$ is maintained relatively small, and further, so that the minor fluctuations in the voltage at node 22 will result in only small changes in $I_d$ which are imperceptible to the user.

The incremental resistance of the signal model of a diode of an ordinary silicon diode is $$R_d = nV_t/I_d$$

wherein $R_d$ is the small signal resistance of the diode, n is a parameter based on the physical structure of a diode and is specific to the diode chosen and $I_d$ is the bias current passing through the diode at a particular instant in time. $V_t = KT/q$ where K is Boltzmann's constant, T is the absolute temperature in degrees Kelvin and q is the magnitude of electronic charge. At room temperature, (22 degrees C.) the value of $V_t$ is 25 mV. Therefore, at a fixed temperature for a particular diode, increasing $I_d$ decreases the small signal resistance and correspondingly, decreasing $I_d$ increases the small signal resistance.

The gain of op-amp 26 in the inverting configuration varies inversely with input resistance, in accordance with the formula $G = -(R_f/R_i)$ wherein G is the gain, $R_f$ is a fixed, predetermined feedback resistor, and $R_i$ is the input resistance. In this example, resistor 32 is the fixed feedback resistor $R_f$ and input resistance $R_i$ is the series combination of resistor 42 and the incremental resistance of diode 46. Thus, if $R_i$ is made smaller by reducing the diode resistance, the gain increases. In accordance with an aspect of the invention, $R_i$ is reduced by increasing the duty cycle of the pulses, thus causing the magnitude of the reference voltage and Id to be larger, thereby reducing the diode resistance and resulting in an increased gain. Similarly, in accordance with an aspect of the invention, if $R_i$ is made larger by increasing the diode resistance, accomplished by reducing the duty cycle of the pulses and correspondingly the reference voltage and $I_d$, the gain decreases. Note that the feedback used for establishing the gain of an op-amp is not the same as the mentioned feedback used in prior systems to monitor the actual value of the gain controlling factor or mechanism. The minus sign in the gain formula indicates that the output of the op-amp is 180 degrees out of phase with the input.

An advantage of this implementation is that as the incremental resistance of the diode is decreased, less of the AC input signal appears across diode 46 due to the AC voltage divider action between resistor 42 and diode 46. This voltage divider action allows the diode to operate in the piecewise linear region over a wide range of input signals. Another advantage of this implementation is the ability to set the minimum gain to a value other than zero by the incorporation of optional resistor 44. The overall input resistance, and thus the gain, is determined by the sum of resistor 42 and the parallel combination of resistor 44 and the incremental resistance of diode 46.

Naturally other implementations of the invention can be envisioned. These would include but are limited to regulating the incremental resistance of the diode by using the reference signal to regulate the voltage at the cathode of the diode or using the diode in a shunt mode rather than in the presented series mode. Also, although in this example a voltage is designated as the reference signal, in other implementations it may be more desirable that the reference signal designated be a current. Thus, in an alternate interpretation of FIG. 1, the average current flowing through resistor 48 can be designated as the reference signal since it too varies directly with the duty cycle of the variable duty cycle pulses. The ultimate designation of which signal is actually the reference signal is therefore left to the discretion of the implementor.

An advantage of the presented types of digital volume control systems is that because of the natural filtering action inherent in the basic operating principals of the system coupled with the large number of discrete duty cycles that even a reasonably highly loaded microprocessor can produce, the transistions between levels can easily be made to appear continuous to a user. Another advantage of the invention is that it can be easily implemented in a system with only a single voltage supply. Further, the use of an energy storing type filter allows, in accordance with another aspect of the invention, the stream of variable duty cycle pulses to be interrupted momentarily so that a pin supplying the variable duty cycle pulses can be used for another function without affecting the perceived volume level. Thus, for example, a microcomputer pin can also be used for supplying variable duty cycle pulses as well as an output for purposes of scanning a key pad for button depressions.

Also shown in FIG. 1 is an example optional mini-keyboard for selecting volume up or volume down by a user. The keyboard and associated circuitry comprises push button switches 78 and 80, pull down resistors 82 and 84 and isolation resistor 86. Pins 88 and 90 of microcomputer 52 are configured as inputs ports. While keyboard scanning techniques are well known in the art, they must be combined with the generation of the variable duty cycle pulses. The keyboard only need be scanned at prescribed intervals and does not need the constant attention of microcomputer 52. When the signals from the keyboard are not being input by microcomputer 12, the signal being supplied to pin 13 is ignored by the keyboard scanning process. At an appropriate time to check the keyboard for switch closures, the value that is being provided to pin 13 as part of a variable duty cycle pulse is temporarily removed. Typically, this value is already stored in a register of microcomputer 52 from which it is copied and supplied to pin 13. Further, the value being output for the variable width pulses is generally determined by an interrupt routine initiated via the timeout of a timer and may actually change during the keyboard scanning operation. The keyboard scanning process in this simple example is initiated by writing a logic one to pin 13 and latching the logic levels appearing at pins 88 and 90. The appropriate value for the variable duty cycle pulses is then replaced at pin 13, by copying the value currently stored in the register, as if the keyboard scanning never took place. Considering switch 78 to signal volume up and switch 80 to signal volume down, a logic one appearing at pin 88 indicated that the user has closed switch 78 and is signaling volume up while a logic zero indicates switch 78 is open. Similarly, a logic one appearing at pin 90 indicates that the user has closed switch 80 and is signaling volume down while a logic zero indicates switch 80 is open. The keyboard is debounced over several cycles. If volume up is signaled, the duty cycle of the variable duty cycle pulses is increased by one unit. If volume down is signaled, the duty cycle of the variable duty cycle pulses is decreased by one unit. If both volume up and volume down are signaled simultaneously the button depressions are ignored and the current duty cycle is maintained.

We claim:

1. Apparatus for digitally regulating the magnitude of an output signal derived from an input signal comprising:
    means for generating a stream of pulses with a controllable variable duty cycle;
    means for controlling said duty cycle of said pulses;
    means for supplying said generated stream of variable duty cycle pulses;
    means for filtering said stream of variable duty cycle pulses to develop a reference signal, the magnitude of said reference signal being responsive to and proportional with the duty cycle of said stream of pulses;
    a two terminal non-linear element having a resistance value that varies in accordance with a current passing through said element;
    an input signal source for supplying said input signal;
    means responsive to the magnitude of said reference signal for varying the instantaneous operating resistance of said two terminal non-linear element; and
    amplifier means with a variable gain for amplifying an input signal from said signal source, said gain of said amplifying circuit being responsive to said instantaneous operating resistance of said two terminal non-linear element.

2. The apparatus as defined in claim 1 wherein said means for generating said stream of pulses is digital.

3. The apparatus as defined in claim 1 wherein said signal from said signal source passes through said two terminal non-linear element whose resistance varies with current.

4. The apparatus as defined in claim 1 wherein said reference signal is a voltage.

5. The apparatus as defined in claim 1 wherein said reference signal is a current.

6. The apparatus as defined in claim 1 wherein said two terminal non-linear element is a diode.

7. The apparatus as defined in claim 1 wherein said reference signal passes through said two terminal non-linear element whose resistance varies with current.

8. The apparatus as defined in claim 1 wherein said means for generating and said means for controlling comprise a microprocessor.

9. The apparatus as defined in claim 1 further including means for receiving a signal indicating an increase in said output magnitude and means for receiving a signal indicating a decrease in said output magnitude and wherein said means for controlling said duty cycle of said pulses is responsive to said signals received by said means for receiving signals for increasing or decreasing said duty cycle in accordance with said signal to correspondingly adjust said output magnitude.

10. The apparatus as defined in claim 1 wherein said means for controlling said duty cycle includes means for varying said duty cycle between 0% and 100%.

11. The apparatus as defined in claim 1 further including means for multiplexing said means for supplying so that said means for supplying supplies other signals in addition to said generated stream of variable duty cycle pulses.

12. The apparatus as defined in claim 11 further including means for generating a periodic signal, means responsive to said periodic signal for producing a first output indicating increase said output magnitude, means responsive to said periodic signal for producing a second output indicating decrease said output magnitude, wherein said means for supplying further supplies on a multiplexed basis said periodic signal and said means for controlling is responsive to said first and second outputs to appropriately determine said duty cycle.

13. The apparatus as defined in claim 11 further including means for generating a periodic signal, one or more switch means for general purpose use, each of said switch means having at least one state, each of said switch means being responsive to said periodic signal so as to produce an output indicative of each of said switch states wherein said means for supplying further supplies said periodic signal.

* * * * *